United States Patent
Shin et al.

(10) Patent No.: US 7,978,006 B2
(45) Date of Patent: Jul. 12, 2011

(54) QUANTUM INTERFERENCE TRANSISTORS AND METHODS OF MANUFACTURING AND OPERATING THE SAME

(75) Inventors: Jai-kwang Shin, Anyang-si (KR); Sun-ae Seo, Hwaseong-si (KR); Jong-seob Kim, Suwon-si (KR); Ki-ha Hong, Seoul (KR); Hyun-jong Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/585,724

(22) Filed: Sep. 23, 2009

(65) Prior Publication Data
US 2010/0090759 A1     Apr. 15, 2010

(30) Foreign Application Priority Data
Oct. 9, 2008   (KR) .................. 10-2008-0099353

(51) Int. Cl.
*H01L 25/00* (2006.01)
(52) U.S. Cl. ....................... 327/566; 327/581
(58) Field of Classification Search .................. 327/427, 327/564, 565, 566, 581
See application file for complete search history.

(56) References Cited

U.S. PATENT DOCUMENTS

| | | | | |
|---|---|---|---|---|
| 4,977,435 | A | * | 12/1990 | Yoshimura et al. ........... 257/194 |
| 5,130,766 | A | * | 7/1992 | Arimoto et al. ............... 257/192 |
| 7,566,897 | B2 | * | 7/2009 | Bibilashvili et al. ............. 257/9 |
| 2007/0064478 | A1 | | 3/2007 | Zhang et al. |
| 2007/0141790 | A1 | | 6/2007 | Datta et al. |
| 2007/0187694 | A1 | | 8/2007 | Pfeiffer |
| 2007/0194297 | A1 | | 8/2007 | McCarthy et al. |

FOREIGN PATENT DOCUMENTS

| | | |
|---|---|---|
| EP | 1 508 926 | 2/2005 |
| JP | 2007-335532 | 12/2007 |

* cited by examiner

*Primary Examiner* — Jeffrey S Zweizig
(74) *Attorney, Agent, or Firm* — Harness, Dickey & Pierce, P.L.C.

(57) ABSTRACT

A quantum interference transistor may include a source; a drain; N channels (N≧2), between the source and the drain, and having N−1 path differences between the source and the drain; and at least one gate disposed at one or more of the N channels. One or more of the N channels may be formed in a graphene sheet. A method of manufacturing the quantum interference transistor may include forming one or more of the N channels using a graphene sheet. A method of operating the quantum interference transistor may include applying a voltage to the at least one gate. The voltage may shift a phase of a wave of electrons passing through a channel at which the at least one gate is disposed.

20 Claims, 5 Drawing Sheets

QUANTUM INTERFERENCE TRANSISTORS AND METHODS OF MANUFACTURING AND OPERATING THE SAME

CROSS-REFERENCE TO RELATED APPLICATION(S)

This application claims priority from Korean Patent Application No. 10-2008-0099353, filed on Oct. 9, 2008 in the Korean Intellectual Property Office (KIPO), the entire contents of which are incorporated herein by reference.

BACKGROUND

1. Field

Example embodiments relate to transistors and/or methods of manufacturing and/or operating the same. Also, example embodiments relate to quantum interference transistors using graphene and/or methods of manufacturing and/or operating the same.

2. Description of the Related Art

One method of increasing the integration degree of a semiconductor device may be to reduce the size of elements of the semiconductor device. Thus, attempts may be made to reduce the size of elements that have been not considered before. For example, the length of channels of a transistor generally used in semiconductor devices may be much greater than a coherence wavelength $\lambda_{coherence}$ of electrons. Accordingly, the wave nature of electrons is not considered in general semiconductor transistors.

However, the integration degree of semiconductor devices may increase and/or design rules of semiconductor devices may now be on the scale of nanometers. Thus, the length of channels of the transistor may be smaller than the coherence wavelength $\lambda_{coherence}$ of electrons. In this case, in understanding the transportation and/or transfer of electrons in the channels of the transistor, electrons are regarded not as particles, but as waves. That is, the behavior of electrons may be interpreted quantum-dynamically.

Thus, a transistor in which the behavior of electrons in channels of the transistor may be interpreted as waves, and/or whose operation may be determined by interference of waves, is hereinafter referred to as a quantum interference transistor.

An example of a quantum interference transistor may be a transistor that uses the wave nature of electrons in 2D electron gas, a super-conductor, or molecules. A quantum interference transistor of this kind may be operated at a high frequency of about 10 THz and may have low power consumption, but may be difficult to manufacture. In particular, in the case of a quantum interference transistor using 2D electron gas or a super conductor, the quantum interference transistor may operate at a temperature much lower than 50 K, and thus may be hardly utilized.

SUMMARY

Example embodiments may include a quantum interference transistor that may be manufactured using a manufacturing process of a related art and/or may operate at a temperature around room temperature. Example embodiments also may include methods of manufacturing and/or operating the quantum interference transistor.

To achieve the above and/or other aspects, example embodiments may include a quantum interference transistor including a source, a drain, a graphene sheet including N channels (N≧2), between the source and the drain, and having N–1 path differences between the source and the drain; and at least one gate at one or more of the N channels.

The source and/or the drain may part of the same or different graphene sheet.

The path difference may be such that waves of electrons passing through the channels generate destructive interference in the drain.

The gate stack may be formed on at least one of the plurality of channel paths. The gate stack may be formed at least one of above and below the graphene sheet. Also, the gate stack may be formed to surround a portion of the channels. The gate stack may include a gate insulating layer and/or a gate.

To achieve the above and/or other aspects, example embodiments may include a method of manufacturing a quantum interference transistor including a source, a drain, N channels (N≧2), between the source and the drain, and having N–1 path differences between the source and the drain, and at least one gate at one or more of the channels, the method comprising forming the N channels using a graphene sheet.

In example methods, the source and/or the drain may also be formed of the graphene sheet.

The method may further include forming the graphene sheet on a substrate on which a quantum interference transistor is to be formed; forming a mask defining the channel on the graphene sheet; removing the graphene sheet around the mask; and/or removing the mask.

The gate stack may be formed before and/or after the forming of the graphene sheet.

When a portion of the gate is formed before the graphene sheet is formed, and the rest of the gate is formed after the graphene sheet is formed, the gate portion formed before forming the graphene sheet and the gate portion formed after forming the graphene sheet may be formed to be separate from each other or to be connected to each other.

To achieve the above and/or other aspects, example embodiments may include including a source, a drain, N channels (N≧2), between the source and the drain, and having N–1 path differences between the source and the drain, and at least one gate at one or more of the channels, the method including applying a voltage to the gate, wherein the voltage may shift a phase of a wave of electrons passing through the channel at which the gate is disposed.

A quantum interference transistor may include a source, a drain, a graphene sheet including N channels (N≧2), between the source and the drain, and having N–1 path differences between the source and the drain, and at least one gate at one or more of the N channels.

A method of manufacturing the quantum interference transistor may comprise forming the channels using a graphene sheet.

A method of operating the quantum interference transistor may comprise applying a voltage to the gate. The voltage may shift a phase of a wave of electrons passing through a channel at which the gate is disposed.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION

Figure 1:
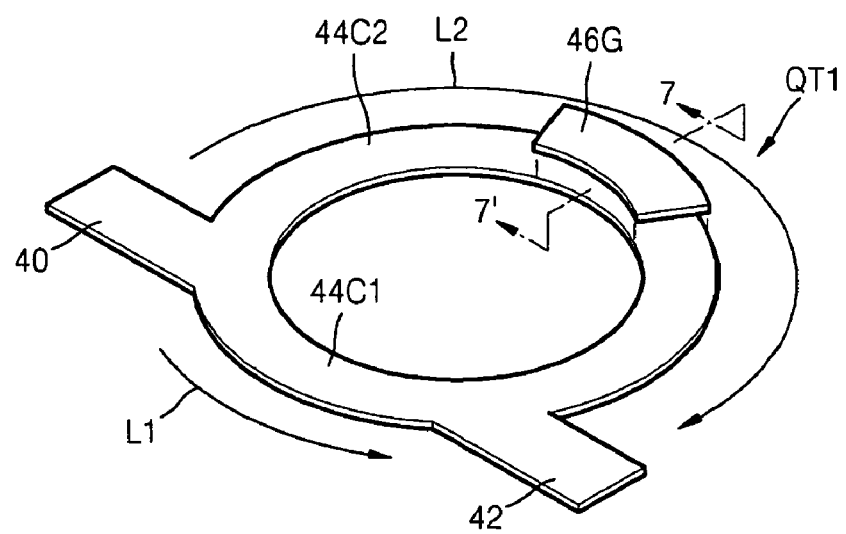
FIGS. 1 through 6 are perspective views of quantum interference transistors according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

First, quantum interference transistors according to example embodiments will be described.

FIGS. 1 through 6 are perspective views of quantum interference transistors according to example embodiments.

Referring to FIG. 1, a quantum interference transistor QT1 according to example embodiments may include a source 40, a drain 42, and/or channels 44C1 and 44C2 in a graphene sheet. The effective mass of electrons in the graphene sheet may be 0 at 300 K. Also, the coherence wavelength λcoherence of electrons in the graphene sheet may be 1 micrometer or greater at 300 K. Thus, the quantum interference transistor QT1 may be operated substantially at a room temperature and/or may be used in various fields. A first channel 44C1 and/or a second channel 44C2 may be provided between the source 40 and the drain 42. The first and second channels 44C1 and 44C2 may meet at the source 40 and/or the drain 42, but may be separated from each other between the source 40 and the drain 42. Both of the first and second channels 44C1 and 44C2 may be as long as the coherence wavelength of electrons or shorter than the coherence wavelength of electrons. The lengths L1 and L2 (that may or may not be predetermined) of the first and second channels 44C1 and 44C2 may be different from each other. A difference L2−L1 between the length L1 of the first channel 44C1 and the length L2 of the second channel 44C2, constituting a path difference, may be expressed as in Equation 1 below:

$$L2-L1 \sim n(\lambda_D/2) \quad \text{[Equation 1]}$$

where n may be 1, 3, 5, . . . , and $\lambda_D$ may be a wavelength of electrons in the first and second channels 44C1 and 44C2.

According to Equation 1, among electrons leaving the source 40, electrons passing through the first channel 44C1 and electrons passing through the second channel 44C2 may have a phase difference of 180 degrees due to the path difference L2−L1. Accordingly, in the drain 42, destructive interference may be generated between the wave of the electrons passing through the first channel 44C1 and the wave of the electrons passing through the second channel 44C2. Thus, as long as the path difference L2−L1 between the first and second channels 44C1 and 44C2 satisfies Equation 1, current may not flow between the source 40 and the drain 42.

Further, referring to FIG. 1, a gate 46G may be disposed at the second channel 44C2. In more detail, the gate 46G may be formed above the second channel 44C2. Alternatively, the gate 46G may be formed above the first channel 44C1. As a voltage is applied to the gate 46G, the phase of the wave passing through the second channel 44C2 above which the gate 46G is formed, that is, the phase of the wave of electrons, may change. In other words, the phase of the wave of electrons may be shifted. The direction of the phase shift of the wave of electrons may vary according to the polarity of voltage applied to the gate 46G. If a positive voltage is applied to the gate 46G, the phase of the wave of electrons passing through the second channel 44C2 may be, for example, before the phase of the wave of electrons passing through the first channel 44C1. In contrast, if a negative voltage is applied to the gate 46G, the phase of the wave of electrons passing through the second channel 44C2 may be, for example, behind the wave of electrons passing through the first channel 44C1. Thus, by controlling the voltage applied to the gate 46G, the phase of the wave of electrons passing through the second channel 44C2 may be adjusted to the phase of the wave of electrons passing through the first channel 44C1. Accordingly, in the drain 42, constructive interference may be generated between the electrons passing through the first channel 44C1 and the electrons passing through the second channel 44C2. As a result, current may flow between the source 40 and the drain 42. The voltage applied to the gate 46G to shift the phase of the wave of electrons passing through the channel to which the gate 46G is disposed may be small, and thus power consumption may be reduced.

Figure 2:
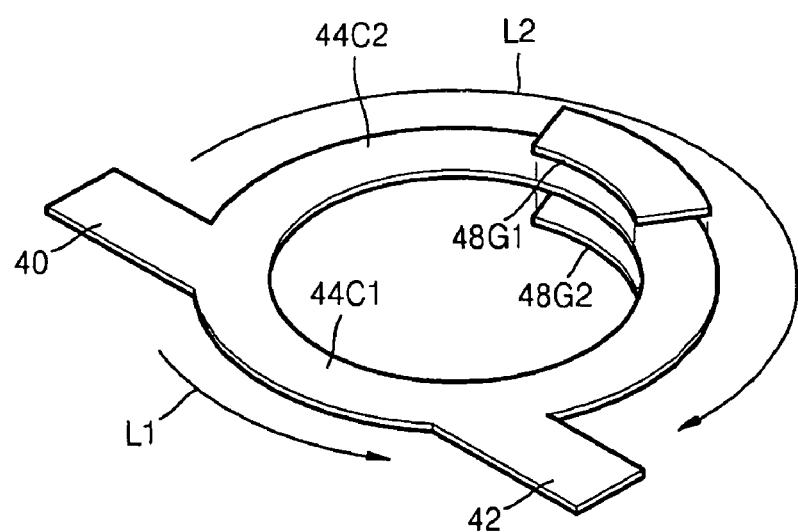

FIG. 2 illustrates a quantum interference transistor, according to example embodiments.

Referring to FIG. 2, two gates may be disposed at the second channel 44C2. In detail, a first gate 48G1 and/or a second gate 48G2 may be formed above and/or below the second channel 44C2, respectively. The first gate 48G1 may be the same or substantially the same as the gate 46G of FIG. 1. The function of the first and second gates 48G1 and 48G2 may be the same as that of the gate 46G. A positive voltage may be applied to the first gate 48G1, and/or a negative voltage may be applied to the second gate 48G2. Alternatively, the first and second gates 48G1 and 48G2 may be formed above and/or below the first channel 44C1, respectively. The first and second gates 48G1 and 48G2 may be separated from each other.

Figure 3:
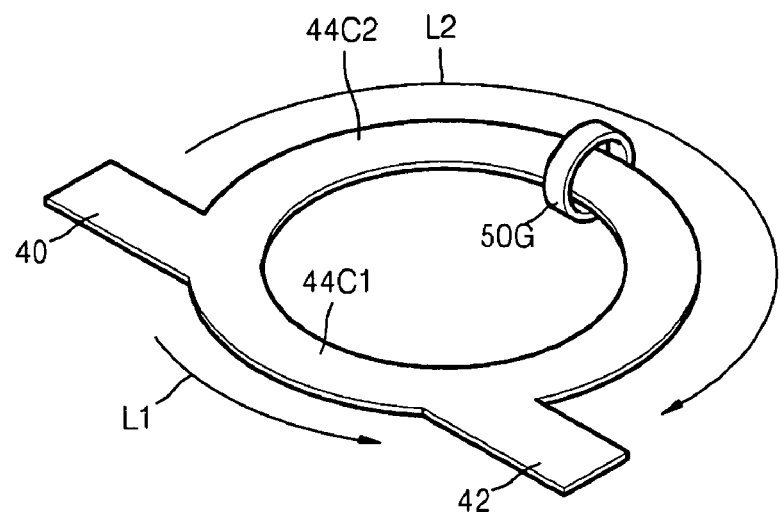

FIG. 3 illustrates a quantum interference transistor according to example embodiments.

Referring to FIG. 3, a ring type gate 50G may be disposed around the second channel 44C2. The ring type gate 50G may surround a portion of the second channel 44C2. While the gates of FIG. 1 or FIG. 2 may be a top gate above the channel and/or a bottom gate below the channel, the rest of the structure of the quantum interference transistor shown in FIG. 3 may be the same as in FIG. 1. The function of the ring type gate 50G may be, for example, the same as or similar to the gate 46G of FIG. 1. Alternatively, the ring type gate 50G may be disposed at the first channel 44C1. The ring type gate 50G may be disposed at the first and second channels 44C1 and 44C2. When a ring type gate 50G is disposed at the first and second channels 44C1 and 44C2, a voltage for generating constructive interference may be applied to only one of the ring type gates 50G. Alternatively, when a ring type gate 50G is disposed at the first and second channels 44C1 and 44C2, a voltage may be applied to each of the ring type gates 50G of the first and second channels 44C1 and 44C2, and the voltage may be applied differently to each of the ring type gates so as to generate a constructive interference.

Figure 4:
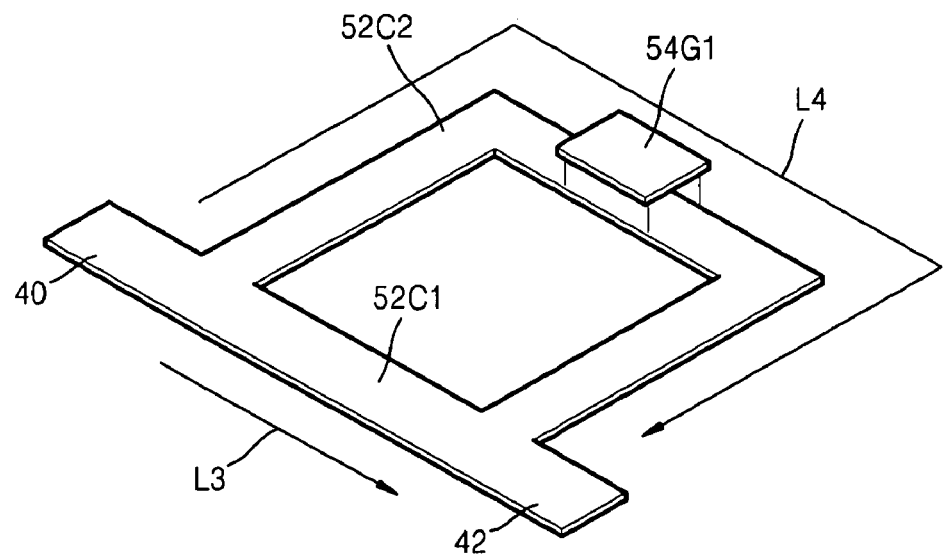

FIG. 4 illustrates a quantum interference transistor according to example embodiments.

Referring to FIG. 4, the quantum interference transistor may include a rectangular type channel which is composed of two channels 52C1 and 52C2, in contrast to the quantum interference transistors of FIGS. 1 through 3, which include a ring type channel which is composed of the first and second channels 44C1 and 44C2. A first channel 52C1 having a length L3 (that may or may not be predetermined) may connect the source 40 and the drain 42, for example, linearly, and/or a second channel 52C2 may have a length L4 (that may or may not be predetermined) that is longer than the first channel 52C1 and/or may constitute, for example, three sides of a rectangle. A path difference L4−L3 between the length L4 of the second channel 52C2 and the length L3 of the first channel 52C1 may be expressed similarly to Equation 1 described above (e.g., L4−L3~n($\lambda_D$/2), where n may be 1, 3, 5, . . . , and $\lambda_D$ may be a wavelength of electrons in the first and second channels 52C1 and 52C2). A top gate 54G1 may be formed above the second channel 52C2. The top gate 54G1 may be formed above a section of the second channel 52C2. The function of the top gate 54G1 may be the same as or similar to the top gate 46G of FIG. 1. Alternatively, the top gate 54G1 may be formed on the first channel 52C1. Also, a top gate 54G1 may be formed both on the first and second channels 52C1 and 52C2. At this time, the quantum interference transistor may be driven in the same manner or a similar manner as that described with reference to FIG. 3.

Figure 5:
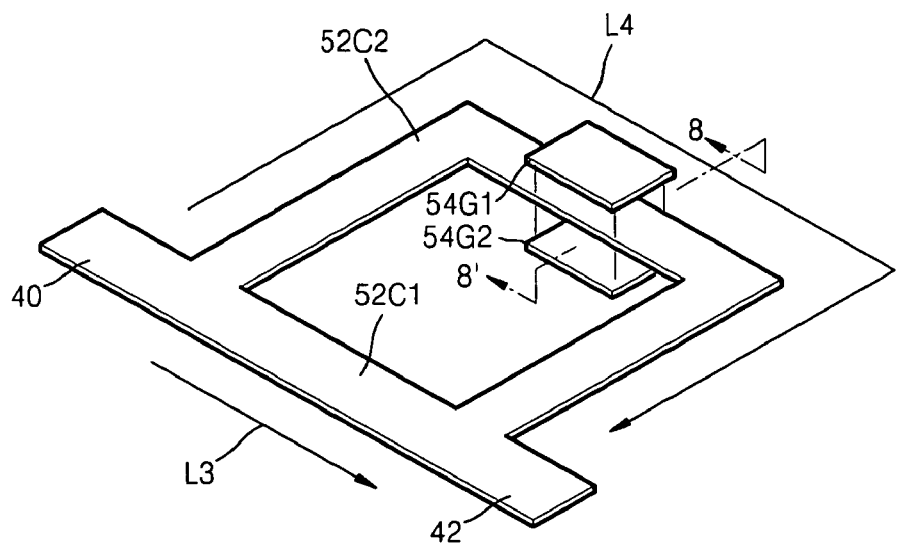

Meanwhile, as illustrated in FIG. 5, a bottom gate 54G2 may be further disposed under the top gate 54G1, having the second channel 52C2 interposed between the top gate 54G1 and the bottom gate 54G2. Alternatively, the top gate 54G1 and/or the bottom gate 54G2 may be disposed at the first channel 52C1. When the top gate 54G1 and the bottom gate 54G2 are formed, the quantum interference transistor may be driven in the same manner or a similar manner as that described with reference to FIG. 2.

Figure 6:
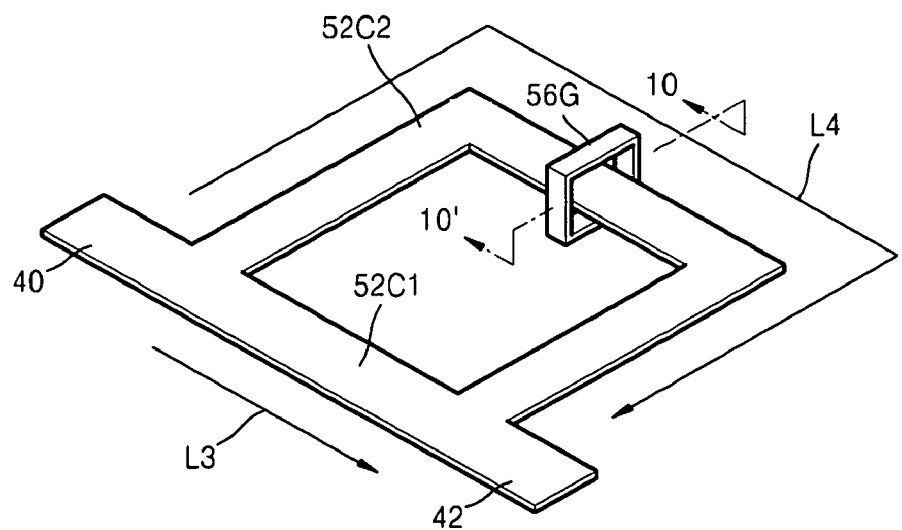

FIG. 6 illustrates a quantum interference transistor according to example embodiments.

Referring to FIG. 6, a gate 56G may be disposed at the second channel 52C2. The gate 56G may surround a portion of the second channel 52C2. In this regard, the shape of the gate 56G may be, for example, rectangular. The rest of the structure of the quantum interference transistor shown in FIG. 6 may be the same as or similar to the quantum interference transistor of FIG. 4. Also, for example, the shape of the gate 56G may be triangular. Alternatively, the gate 56G may be disposed at the first channel 52C1.

Meanwhile, although not illustrated in the drawings, the quantum interference transistor may be formed on a perpendicular plane or on an inclined plane.

Hereinafter, a method of manufacturing a quantum interference transistor according to example embodiments will be described.

The quantum interference transistor according to example embodiments may include a source, a drain, and/or a channel. Two or more of the source, the drain, and the channel may be formed of graphene sheets. Two or more of the source, the drain, and the channel may be formed simultaneously. Thus, here, the description will focus on a method of forming a section of a channel where a gate may be formed.

Figure 7:
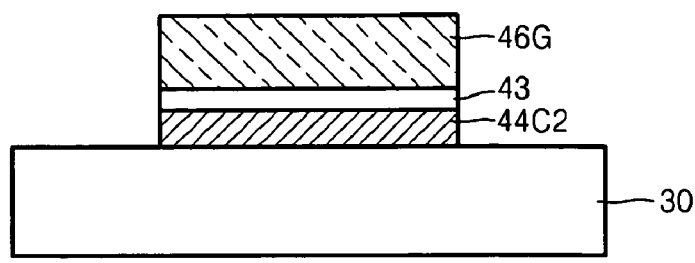
FIG. 7 is a cross-sectional view of the quantum interference transistor of FIG. 1 cut along a line 7-7', for describing methods of manufacturing the quantum interference transistor of FIG. 1, according to example embodiments.
Figure 8:
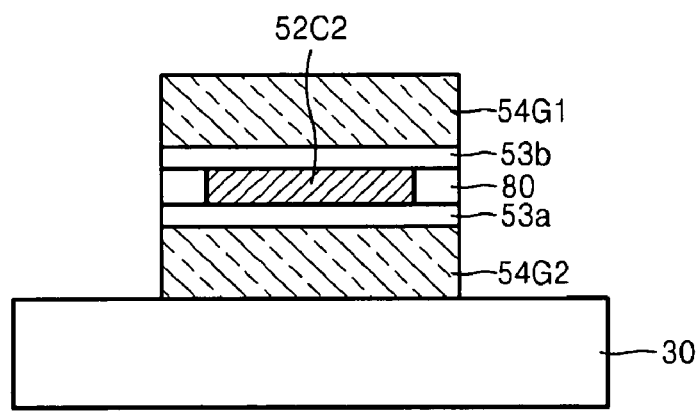
FIG. 8 is a cross-sectional view of the quantum interference transistor of FIG. 5 cut along a line 8-8', for describing methods of manufacturing the quantum interference transistor of FIG. 5, according to example embodiments.
Figure 9:
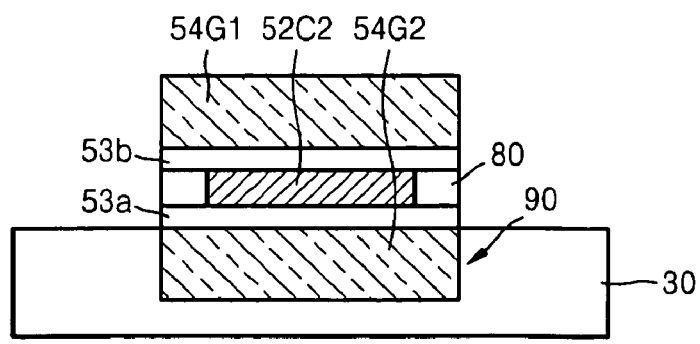
FIG. 9 is a cross-sectional view of the quantum interference transistor of FIG. 8 according to example embodiments.
Figure 10:
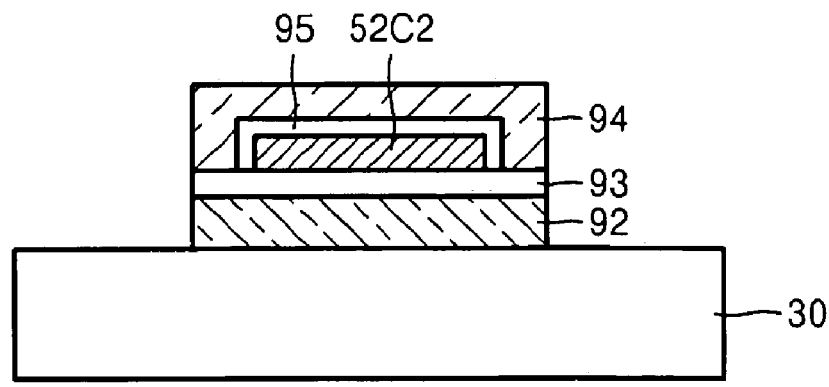
FIG. 10 is a cross-sectional view of the quantum interference transistor of FIG. 6 cut along a line 10-10', for describing methods of manufacturing the quantum interference transistor of FIG. 6, according to example embodiments.

For example, FIG. 7 is a cross-sectional view of the quantum interference transistor QT1 of FIG. 1, cut along a line 7-7', for describing methods of manufacturing the quantum interference transistor of FIG. 1, according to example embodiments. FIG. 8 is a cross-sectional view of the quantum interference transistor of FIG. 5 cut along a line 8-8', for describing methods of manufacturing the quantum interference transistor of FIG. 5, according to example embodiments. FIG. 9 is a cross-sectional view of the quantum interference transistor of FIG. 5 according to example embodiments, for describing methods of manufacturing the quantum interference transistor of FIG. 5. FIG. 10 is a cross-sectional view of the quantum interference transistor of FIG. 6 cut along a line 10-10', for describing methods of manufacturing the quantum interference transistor of FIG. 6, according to example embodiments.

Methods of manufacturing the quantum interference transistors of FIGS. 1, 5, and 6 are explained with respect to FIGS. 7, 8 and 9, and 10, respectively.

First, a method of manufacturing the quantum interference transistor of FIG. 1 will be described.

Referring to FIG. 7, the second channel 44C2 may be formed on a substrate 30. The substrate 30 may be a semiconductor substrate. The substrate 30 may further include an insulating layer on an upper surface of the substrate 30. The second channel 44C2 may be formed of a graphene sheet. The second channel 44C2 may be formed by forming a graphene sheet on the upper surface of the substrate 30 and patterning the graphene sheet. In detail, a mask defining the graphene sheet in the shape as illustrated in FIG. 1 may be formed on the graphene sheet formed on the upper surface of the substrate 30. The mask may be patterned such that portions defining the first and second channels 44C1 and 44C2 of FIG. 1 are formed to satisfy the condition of path difference of Equation 1. Then, the graphene sheet may be etched according to the shape of the mask and the mask may be removed, thereby forming the graphene sheet having the source 40, the drain 42, and the first and second channels 44C1 and 44C2, as illustrated in FIG. 1. In FIG. 1, only the first and second channels 44C1 and 44C2 may be graphene sheets. Also, in FIGS. 2 through 6, only the channels 44C1, 44C2, 52C1, and 52C2 may be graphene sheets. Next, a gate insulating layer 43 may be formed on the second channel 44C2 and a gate 46G may be formed on the gate insulating layer 43. The gate insulating layer 43 may be, for example, an oxide layer or a nitride layer. Together, the gate insulating layer 43 and the gate 46G may constitute a gate stack. Thus, the manufacture of the quantum interference transistor of FIG. 1 may be completed.

Next, a method of manufacturing the quantum interference transistor of FIG. 5 will be described. Terminology and reference numerals of the elements are the same as those described with reference to FIG. 5.

Referring to FIG. 8, the bottom gate 54G2 and a first gate insulating layer 53a may be sequentially formed on the substrate 30. Together, the first gate insulating layer 53a and the bottom gate 54G2 may constitute a first gate stack. The first gate insulating layer 53a may be, for example, an oxide layer or a nitride layer. The second channel 52C2 may be formed on the first gate insulating layer 53a. The second channel 52C2, the source 40, the drain 42, and the first channel 52C1 of FIG. 5 may be formed at the same time or almost the same time. The second channel 52C2, the source 40, the drain 42, and the first channel 52C1 of FIG. 5 also may be formed using an etching method with a mask in the same manner as that described with reference to FIG. 7. Next, an insulating layer 80 may be formed around the second channel 52C2. The insulating layer 80 also may be formed around the source 40, the drain 42, and/or the first channel 52C1 of FIG. 5. A second gate insulating layer 53b covering the second channel 52C2 may be formed on the insulating layer 80. The insulating layer 80 and the second gate insulating layer 53b may be a single insulating layer that may be formed on the first gate insulating layer 53a to cover the second channel 52C2. The second gate insulating layer 53b may be the same as the first gate insulating layer 53a. The top gate 54G1 may be formed on the second gate insulating layer 53b. The top gate 54G1 may be formed above the bottom gate 54G2. Together, the top gate 54G1 and the second gate insulating layer 53b may constitute a second gate stack.

Thus, the manufacture of a quantum interference transistor having a dual gate structure, that is, including the top gate 54G1, and the bottom gate 54G2, may be completed.

Meanwhile, as illustrated in FIG. 9, the bottom gate 54G2 may also be formed by forming a recess area 90 in the substrate 30 and filling the recess area 90.

Next, a method of manufacturing the quantum interference transistor of FIG. 6 will be described with reference to FIG. 10. Terminology and reference numerals of the elements are the same as those described with reference to FIG. 6.

Referring to FIG. 10, a first gate conductive layer 92 may be formed on the substrate 30.

Next, a gate insulating layer 93 may be formed on the first gate conductive layer 92. The gate insulating layer 93 may be, for example, an oxide layer or a nitride layer. Then a graphene sheet (not shown) may be formed on the gate insulating layer 93. The graphene sheet may be patterned using the above-described patterning method with a mask. Thus, a second channel 52C2 of the graphene sheet may be formed on an upper surface of the gate insulating layer 93. The second channel 52C2 may be formed to be above the first gate conductive layer 92. Then, the second channel 52C2 may be covered with a gate insulating layer 95. A second gate conductive layer 94 may be formed to cover the second channel 52C2 covered with the gate insulating layer 95 on the gate insulating layer 93. The first and second gate conductive layers 92 and 94 may correspond to the gate 56G of FIG. 6. A stack including the first and second gate conductive layers 92 and 94 and the gate insulating layers 93 and 95 may be a gate stack surrounding the second channel 52C2.

Thus, a quantum interference transistor including the gate 56G surrounding the second channel 52C2 may be formed.

Figure 11:
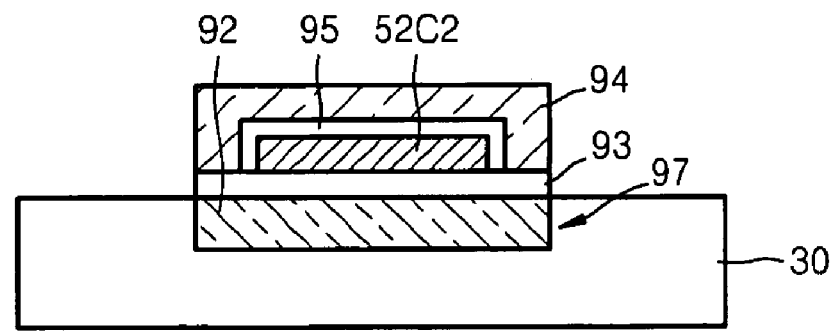
FIG. 11 is cross-sectional view of the quantum interference transistor of FIG. 6 cut along a line 10-10', for describing methods of manufacturing the quantum interference transistor of FIG. 6, according to example embodiments.

Meanwhile, as illustrated in FIG. 11, the first gate conductive layer 92 may be formed by forming a recess area 97 in the substrate 30 and filling the recess area 97.

The quantum interference transistors illustrated in FIGS. 2 through 4 may be formed using one of the above-described manufacturing methods.

As described above, in the methods of manufacturing the quantum interference transistors of FIGS. 1 through 6, a photographic etching process, that also may be used in processes of manufacturing semiconductor devices of the related art, may be used. Accordingly, the quantum interference transistors of FIGS. 1 through 6 may be easily manufactured.

Next, methods of operating the quantum interference transistors according to example embodiments will be described.

In detail, a voltage (that may or may not be predetermined) may be applied to a gate (one of the gates illustrated in FIGS. 1 through 6), to operate the quantum interference transistor. As a voltage is applied to the gate, the phase of the wave of electrons passing through the channel, to which the gate is disposed, may be shifted, and thus constructive interference may be generated in the drain between the wave of electrons passing through the channel to which the gate is disposed and the wave of electrons passing through the other channel to which the gate is not disposed. The applied voltage may be a positive voltage or a negative voltage.

Meanwhile, when the lengths of the two channels connecting the source and the drain may be identical or nearly identical, a gate may be formed in each of the two channels, and different voltages may be applied to the gates so that the two waves of electrons passing through the channels generate constructive interference in the drain.

On the other hand, when the path difference of the two channels of the quantum interference transistors illustrated in FIGS. 1 through 6 is a path difference that may result in constructive interference and not destructive interference, then a voltage generating destructive interference may be applied to the gate which may be one of the gates illustrated in FIGS. 1 through 6. The application of the voltage may be stopped temporarily when constructive interference is needed, that is, when a current needs to flow between the source and the drain.

Example embodiments set forth above illustrate elements and features in combination; however, the disclosed combinations are not exclusive. Example embodiments may also include any combination of elements and/or features discussed above.

While example embodiments have been particularly shown and described, it will be understood by those of ordinary skill in the art that various changes in form and details may be made therein without departing from the spirit and scope of the present invention as defined by the following claims.

What is claimed is:

1. A quantum interference transistor, comprising:
   a source;
   a drain;
   a graphene sheet including N channels (N≧2), between the source and the drain, and having N−1 path differences between the source and the drain; and
   at least one gate at one or more of the N channels.

2. The quantum interference transistor of claim 1, wherein the path difference is such that waves of electrons passing through at least one of the N channels generate destructive interference in the drain.

3. The quantum interference transistor of claim 1, wherein the path difference is such that waves of electrons passing through at least one of the N channels generate constructive interference in the drain.

4. The quantum interference transistor of claim 1, wherein the at least one gate is at least one of above and below the graphene sheet, the quantum interference transistor further comprising:
   a gate insulating layer between the at least one gate and the graphene sheet.

5. The quantum interference transistor of claim 1, wherein the at least one gate surrounds a portion of at least one of the N channels.

6. The quantum interference transistor of claim 1, wherein the graphene sheet further includes the source and the drain.

7. A method of manufacturing a quantum interference transistor including a source, a drain, N channels (N≧2), between the source and the drain, and having N−1 path differences between the source and the drain, and at least one gate at one or more of the channels, the method comprising:
   forming the N channels using a graphene sheet.

8. The method of claim 7, wherein forming the N channels using a graphene sheet comprises:
   forming the graphene sheet on a substrate on which a quantum interference transistor is to be formed;
   forming a mask defining the N channels on the graphene sheet;
   removing the graphene sheet around the mask; and
   removing the mask.

9. The method of claim 8, wherein the at least one gate is formed at least one of before and after forming the graphene sheet.

10. The method of claim 9, wherein when a portion of the at least one gate is formed before forming the graphene sheet and the rest of the at least one gate is formed after forming the graphene sheet, the gate portion formed before forming the graphene sheet and the gate portion formed after forming the graphene sheet are formed to be separate from each other or to be connected to each other, and a gate insulating layer is formed between the at least one gate and the graphene sheet.

11. The method of claim 7, wherein the path difference is such that waves of electrons passing through at least one of the N channels generate destructive interference in the drain.

12. The method of claim 7, wherein the path difference is such that waves of electrons passing through at least one of the N channels generate constructive interference in the drain.

13. The method of claim 8, wherein the path difference is such that waves of electrons passing through at least one of the N channels generate destructive interference in the drain.

14. The method of claim 8, wherein the path difference is such that waves of electrons passing through at least one of the N channels generate constructive interference in the drain.

15. A method of operating a quantum interference transistor including a source, a drain, N channels (N≧2) in a graphene sheet, between the source and the drain, and having N−1 path differences between the source and the drain, and at least one gate at one or more of the channels, the method comprising:
   applying a voltage to the at least one gate;
   wherein the voltage shifts a phase of a wave of electrons passing through at least one of the N channels at which the at least one gate is disposed.

16. The method of claim 15, wherein the path difference is such that waves of electrons passing through at least one of the N channels generate destructive interference in the drain or constructive interference in the drain.

17. The method of claim 15, wherein the source and the drain are formed in the graphene sheet.

18. The method of claim 15, wherein the at least one gate is formed at least one of above and below the graphene sheet wherein a gate insulating layer exists between the at least one gate and the graphene sheet.

19. The method of claim 15, wherein the at least one gate surrounds a portion of the one or more of the channels at which the gate is disposed.

20. The method of claim 16, wherein the source and the drain are formed in the graphene sheet.

* * * * *